(12) United States Patent
Andry et al.

(10) Patent No.: US 7,820,521 B2
(45) Date of Patent: Oct. 26, 2010

(54) CONDUCTIVE THROUGH VIA STRUCTURE AND PROCESS FOR ELECTRONIC DEVICE CARRIERS

(75) Inventors: Paul S. Andry, Yorktown Heights, NY (US); Chirag S. Patel, Peekskill, NY (US); Edmund J. Sprogis, Underhilll, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 119 days.

(21) Appl. No.: 12/335,605

(22) Filed: Dec. 16, 2008

(65) Prior Publication Data
US 2009/0120679 A1 May 14, 2009

Related U.S. Application Data

(63) Continuation of application No. 11/214,602, filed on Aug. 30, 2005, now Pat. No. 7,488,680.

(51) Int. Cl.
*H01L 21/76* (2006.01)
(52) U.S. Cl. ...................................... 438/410
(58) Field of Classification Search ....................... None
See application file for complete search history.

(56) References Cited

U.S. PATENT DOCUMENTS

| | | | |
|---|---|---|---|
| 5,640,761 A | 6/1997 | DiStefano et al. | 29/830 |
| 5,998,292 A | 12/1999 | Black et al. | 438/618 |
| 6,033,980 A | 3/2000 | Liou et al. | |
| 6,142,823 A | 11/2000 | Ishibashi | 439/500 |
| 6,175,287 B1 | 1/2001 | Lampen et al. | 333/247 |
| 6,184,060 B1 | 2/2001 | Siniaguine | 438/106 |
| 6,717,254 B2 | 4/2004 | Siniaguine | 257/690 |
| 2004/0033682 A1 | 2/2004 | Lindgren | 438/612 |
| 2004/0147137 A1 | 7/2004 | Hiraiwa et al. | |
| 2005/0037608 A1 | 2/2005 | Andricacos et al. | 438/637 |
| 2005/0121768 A1 | 6/2005 | Edelstein et al. | 257/698 |
| 2006/0001164 A1 | 1/2006 | Chang | |
| 2009/0057899 A1 * | 3/2009 | Cheon et al. | 257/738 |

* cited by examiner

*Primary Examiner*—Charles D Garber
*Assistant Examiner*—André C Stevenson
(74) *Attorney, Agent, or Firm*—John A. Jordan

(57) ABSTRACT

Conductive through vias are formed in electronic devices and electronic device carrier, such as, a silicon chip carrier. An annulus cavity is etched into the silicon carrier from the top side of the carrier and the cavity is filled with insulating material to form an isolation collar around a silicon core region. An insulating layer with at least one wiring level, having a portion in contact with the silicon core region, is formed on the top side of the carrier. Silicon is removed from the back side of the carrier sufficient to expose the distal portion of the isolation collar. The core region is etched out to expose the portion of the wiring level in contact with the silicon core region to form an empty via. The via is filled with conductive material in contact with the exposed portion of the wiring level to form a conductive through via to the wiring level. A solder bump formed, for example, from low melt C4 solder, is formed on the conductive via exposed on the carrier back side. The process acts to make the conductive via fill step independent of the via isolation step.

30 Claims, 6 Drawing Sheets

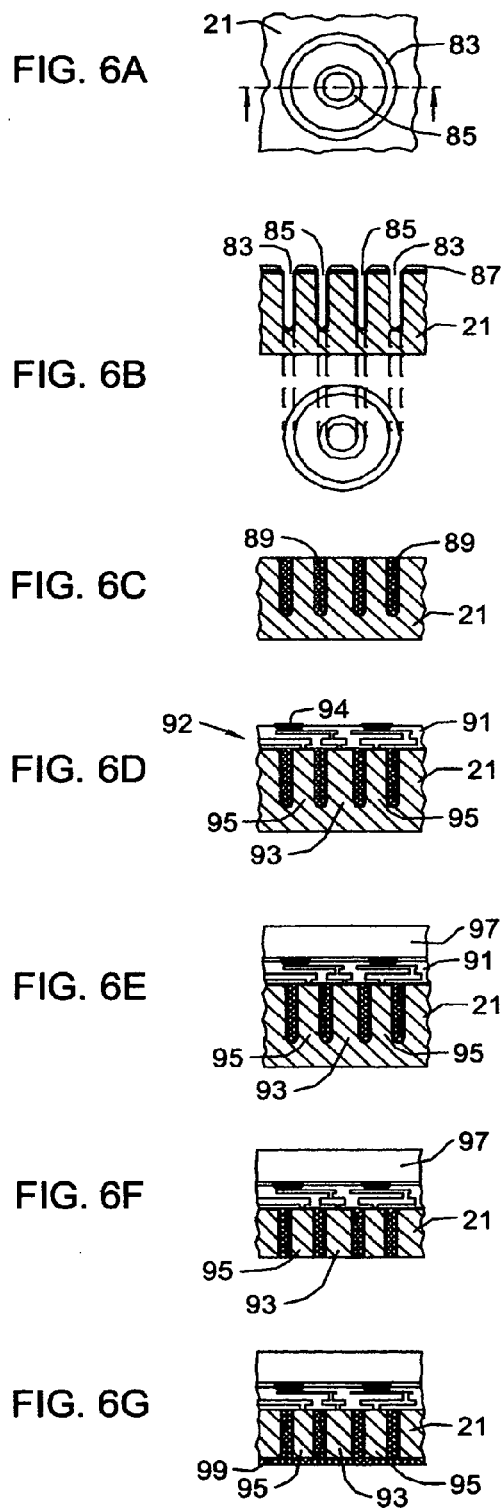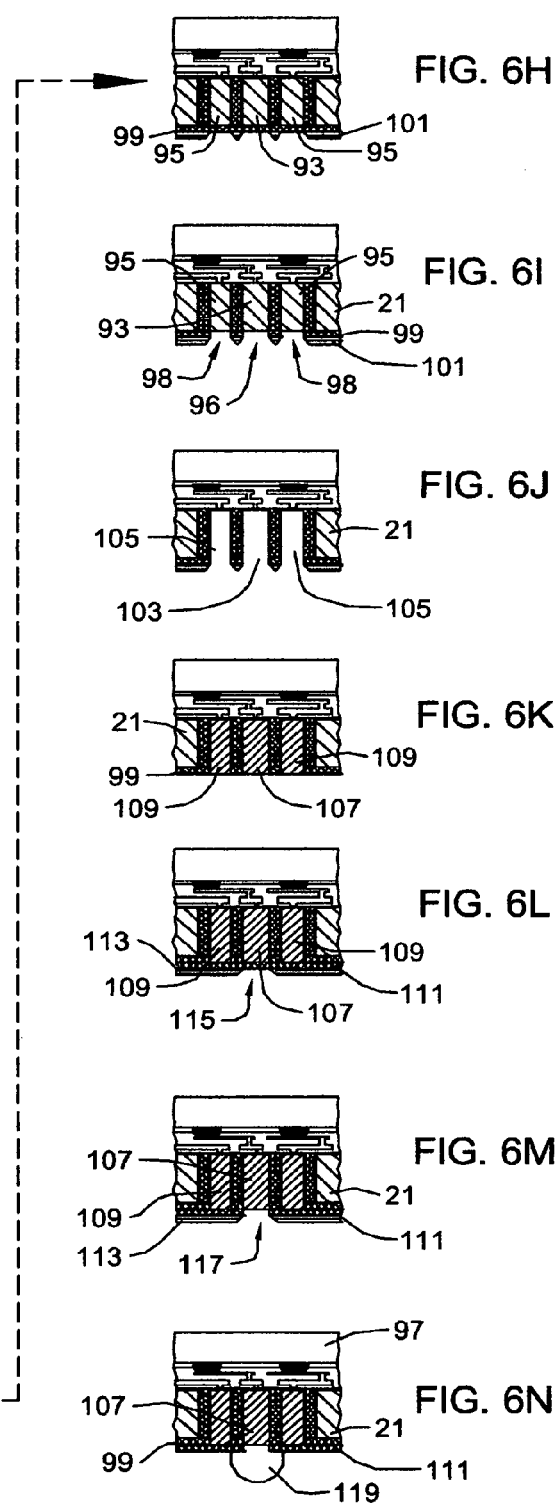

US 7,820,521 B2

CONDUCTIVE THROUGH VIA STRUCTURE AND PROCESS FOR ELECTRONIC DEVICE CARRIERS

This application is a continuation application of U.S. patent application Ser. No. 11/214,602, filed Aug. 30, 2005 now U.S. Pat. No. 7,488,680 and allowed on Oct. 1, 2008.

This invention was made with Government support under Contract NBCH30390004 awarded by the Defense Advanced Research Projects Agency and under Contract H98230-04-C-0920 awarded by the Maryland Procurement Office. The government has certain rights in this invention.

BACKGROUND OF THE INVENTION

1. Field of the Invention

The present invention relates to electrically interconnecting via structures and methods of making same in material, such as, semiconductor material. More particularly, the present invention relates to conductive through via structures and processes for making same in electronic device structures, such as in semiconductor wafers, chips, components and the like, and in electronic device carriers for such semiconductor wafers, chips, components and the like.

2. Background and Related Art

In the packaging of electronic devices, such as, semiconductor chips or wafers, device carriers are used to interconnect the devices. Where electronic devices are connected to another level of packaging, the carriers typically require conductive vias extending through the carrier to connect the devices to the next level of packaging.

Electronic device carriers may be fabricated from a variety of different materials, such as, glass, ceramic, organic and semiconductor materials or combination of these and other materials in single or multiple layers.

Electronic device carriers made of semiconductor material, such as, silicon, offer a number of advantages in packaging, such as ease of manufacturing and reliability. One of the difficulties with fabricating conductive vias in carriers, such as silicon, is forming vias that are reliable. In this regard, a number of processing factors and limitations act to create difficulties in achieving reliable conductive through vias.

The typical prior art approach to creating conductive vias in semiconductor carriers, such as silicon, use what might be called a "vias first" approach. The general steps in such an approach are etching the vias, forming insulation layers on the via walls and metallization. When a "blind via" approach is used, the vias are not etched through the wafer layer so that a "through via" is rendered only after the carrier is suitably thinned to expose the via bottoms. An example of such an approach may be seen in U.S. Pat. No. 5,998,292.

There are, however, a number of difficulties with this type of approach. One difficulty is that this approach requires that the insulation and subsequent metallization must typically completely fill each via, if any wiring layers are to be added to the top. In addition, completely filling vias in silicon carriers without leaving voids is problematic, particularly in deep vias. Formation of the insulation layers on the via walls is typically done through thermal oxidation. Filling the via with metal after thermally oxidized passivation effectively initiates the back end of line (BEOL) process. On the other hand, where passivation is accomplished by chemical vapor deposition (CVD) after BEOL processing, it is difficult to completely cover the walls with oxide in the lower levels of deep vias, particularly around the region of generally intersecting vertical and bottom surfaces, since CVD is not fully conformal. As a result, any exposed silicon may result in metal contamination of the silicon carrier during subsequent front end of line (FEOL) thermal processing steps where the via has been filled with metal, such as Cu.

Moreover, filling insulated vias in the silicon carrier with metal using standard methods, such as plating, for large aspect ratios (e.g. greater than 10:1) tends to lead to plating inclusions and voids which may trap solution causing them to rupture in high-temperature FEOL processing steps.

Another difficulty with creating vias in silicon carriers is that the anisotropic etch of the vias varies both in rate and in maximum depth attainable inversely with size of the feature to be etched. Thus, the ultimate thickness of the carrier is somewhat determined by the feature size. Larger features, such as vias and silicon, can be etched deeper, but they also require thicker metallization to completely fill them. Depending upon the CTE mismatch of metal used to fill the vias and silicon, large stresses can build up in the vias leading to plastic deformation of the metal and/or cracking of the silicon carrier, both of which result in reliability problems.

SUMMARY OF THE PRESENT INVENTION

It is an object of the present invention to provide an improved electronic structure and method for fabricating same.

It is a further object of the present invention to provide an improved conductive via structure for electronic packaging and method for making same.

It is yet a further object of the present invention to provide a through via structure and method for making same that simplifies fabrication and improves yield and reliability of packaged electronic devices.

It is yet still a further object of the present invention to provide an improved through via structure and method of making same which readily allows vias to be fabricated of different diameters on a single electronic structure, such as, a chip carrier structure, etched to nominally the same depths.

It yet another object of the present invention to provide an improved through via structure and method of making which decouples the metallization process step from the insulation process step.

These, as well as other objects, are achieved in the present invention by forming conductive through vias within an annulus cavity structure etched or otherwise formed in a substrate. More particularly, the method of the present invention comprises the steps of:

providing a substrate having an external surface including an external and internal sidewall and a bottom wall defining a cavity with the internal sidewall forming a perimeter around a first volume of the substrate;

forming an insulating layer on the external and internal sidewall and the bottom wall to at least partially fill the cavity;

removing a portion of the substrate below the bottom wall of the cavity; and removing at least a portion of the first volume of the substrate to form an opening therein.

As further provided by the present invention, the step of removing at least a portion of the first volume of the substrate to form an opening therein is carried out by removing from the external surface.

As still further provided by the present invention, the step of removing at least a portion of said substrate below said bottom wall of the cavity removes substrate to expose the first volume of the substrate and the step of removing at least a portion of the first volume of the substrate to form an opening therein is carried out by removing from the first volume of the substrate exposed by the step of removing at least a portion of the substrate.

As yet still further provided by the present invention, the method includes the step of forming an insulating layer having an electrically conductive structure positioned within the perimeter of the internal sidewall and wherein the opening is filled with a conductive material to contact at one end thereof the electrically conductive structure of the insulating layer.

As also provided by the present invention, an electrical contact is formed to connect to the other end of the conductive material and an insulating layer including an electrically conductive structure is formed at least over the other end of the conductive material so that the electrically conductive structure is in contact with the other end of the conductive material.

As further provided by the present invention, active devices and electrical components are formed on the external surface of the substrate with the substrate comprising silicon and the insulating layer formed by thermal oxidation of silicon.

In one embodiment of the present invention, a silicon substrate is provided having an eternal surface including an external and internal sidewall and a bottom wall defining a cavity with the internal sidewall forming a perimeter around a first volume of substrate. An insulating layer is formed on the external and internal sidewall and the bottom wall to at least partially fill the cavity. Another insulating layer is formed on at least a portion of the external surface of the silicon substrate, which layer includes an electrically conductive structure positioned within the perimeter of the internal sidewall. A portion of the substrate below the bottom wall is removed to expose the first volume of silicon substrate. At least a portion of the first volume of substrate is removed to form an opening to the electrically conductive structure and the opening is filled with a conductive material to contact the electrically conductive structure.

In another embodiment of the present invention, a pair of concentric annulus cavity structures is provided. Each annulus cavity is filled with insulating material so that the inner annulus cavity of insulating material circumscribes an inner first volume of core substrate material and the outer annulus cavity of insulating material circumscribes an outer second volume of concentric substrate material positioned between the inner annulus cavity of insulating material and outer annulus cavity of insulating material. The first and second volumes of substrate material are removed and filled with conductive material.

In yet another embodiment of the present invention, the cavity defined by a substrate having an external surface including an external and internal sidewall and a bottom wall with the internal sidewall forming a perimeter around a first volume of substrate has at least a portion of the first volume of substrate removed from the external surface of the substrate to form an opening. The opening is filled with conductive material and a layer of insulation including metallurgy is formed to be connected to the conductive material. The substrate region below the conductive material is removed to expose the conductive material.

Another aspect of the invention relates to an electronic device carrier structure, which is prepared in accordance with the methods of the present invention. In particular, an electronic device carrier structure comprises:

a substrate having an external surface including an external and internal sidewall and a bottom wall defining an annulus cavity with the internal sidewall forming a perimeter around a first volume of the substrate;

insulating material covering the external and internal sidewall and bottom wall to at least partially fill the cavity;

an insulating layer covering at least a portion of the external surface of the substrate with the insulating layer including an electrically conductive structure positioned within the perimeter of the internal sidewall; and conductive material filling a through via within at least a portion of the first volume of substrate to contact the electrically conductive structure.

BRIEF DESCRIPTION OF THE DRAWING

FIG. 6A-6N shows a series of process steps for fabricating a carrier structure in accordance with another embodiment of the present invention.

DETAILED DESCRIPTION OF THE INVENTION

In accordance with the present invention, conductive through vias in electronic device structures, such as, wafer, chips components and the like and in electronic device carriers for same are provided by forming an annulus or ring cavity in the carrier and forming insulating material in the cavity. The carrier material circumscribed by the insulating material is replaced by conductive material to form a conductive through via.

The process allows for the formation of an annular insulating region that surrounds and isolates the conductive via and that is formed independent of the creation of the conductive via. The process effectively allows the via passivation step to be carried out independent of the via conductive fill step. In addition, since the annulus cavity structure requires far less material to be removed than conventional open cylinder approaches and presents twice the wall surface area on which to form insulation and deposit metal, small annulus gaps may be completely filled during typical thermal oxidation so that it is ready for planarization. Back end of line (BEOL) wiring on the planar surface may then be undertaken before the conductive through via, itself, is created. This avoids the uneven surface problems created when conductive vias are formed in the same well as the surrounding insulation in fully open cylindrical vias. Since the via diameter is determined by the size of the annulus core, small via diameters holes may readily be created and easily filled.

Although description of the via structure and method for fabricating same are described in the following embodiments in terms of electronic device carriers, it should be understood that the via structure and method for fabricating same may also be formed in other electronic structures, such as, chip or wafer structures. For example, the via structure and method for fabricating same may be used in device stacking, such as, wafer-to-wafer stacking and chip-to-chip stacking. It is readily apparent that the via structure and process of making same defined by the present invention may be used in any of a variety of other electronic device structures, such as, in imaging devices. Although reference is made to silicon structures, it is also readily apparent that structures of other semiconductor material may also be used.

Figure 1:
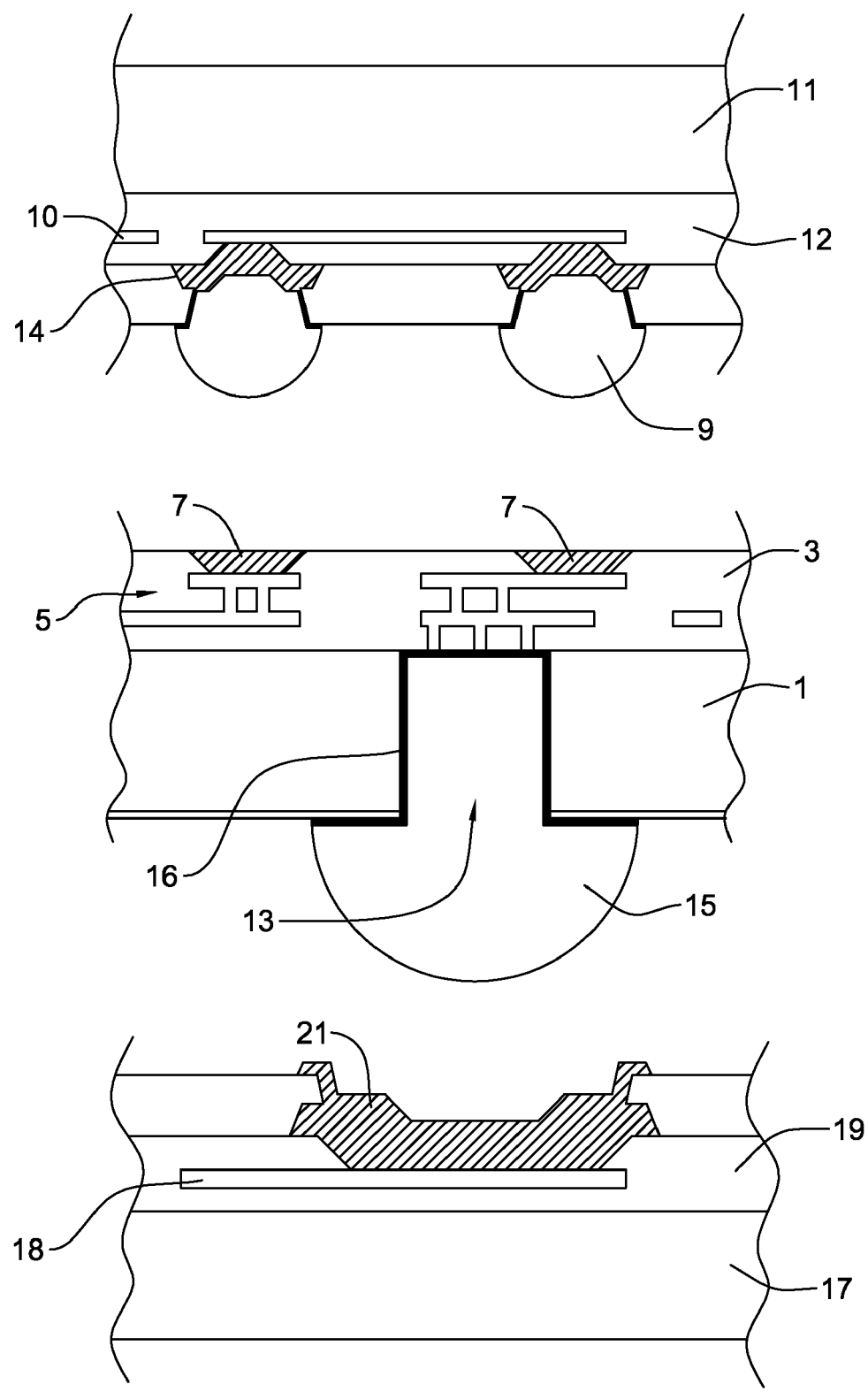
FIG. 1 shows a cross-section of an exploded partial view of a typical carrier arrangement.

With reference to FIG. 1, there is shown a typical electronic device carrier arrangement. Carrier 1 is shown with a layer of insulation 3 containing, for example, two levels of distribution wiring or metallurgy. Top bond pads 7 are arranged to receive low melt solder balls 9 from chip 11. Solder balls 9 are set in bond pads 14. Chip 11 shows one level of wiring or metallization 10 in insulating layer 12.

Through via 13 is filled with a high melt solder which terminates with solder ball 15. The through via may be lined with a metal liner, such as copper, as shown by liner 16. Typically, the high melt and low melt solder balls are C4 solder balls. Substrate 17, shown with a single level of wiring 18 in insulating layer 19, receives solder ball 15 in bond pad 21. Although FIG. 1 shows a partial view, it is known that a full carrier, chip and substrate would contain an array of conductive through vias, bond pads and corresponding solder connections. Assembly methods to form such an electronic device package are well known in the art. In this regard, carrier 1 may also carry other electronic devices (such as capacitors, active devices, etc.) in addition to, or in place of, chip 11.

With reference to FIGS. 2A-2L, there is shown a series of steps depicting a process for fabricating a conductive through via structure in an electronic device carrier, in accordance with one embodiment of the present invention. FIGS. 2B-2L show cross-sectional views of a portion of an electronic device carrier, sufficient to demonstrate how one through via may be fabricated. It is clear that a plurality of such vias may simultaneously be fabricated in a whole carrier using such process.

Figure 2A:
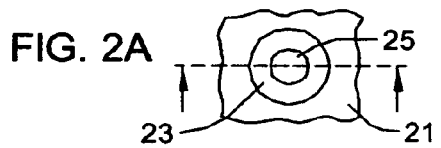
FIG. 2A-2L shows a series of process steps for fabricating a carrier structure in accordance with one embodiment of the present invention.

The carrier substrate material may be any of a variety of insulative or semiconductor materials such as, for example, silicon, fused silica (glass, quartz), ceramic, or another semiconductor or insulator. FIG. 2A shows a top partial view of carrier 21 wherein annulus cavity 23 is shown (as also shown in FIG. 2B) etched into carrier 21 leaving carrier core material 25.

Figure 2B:
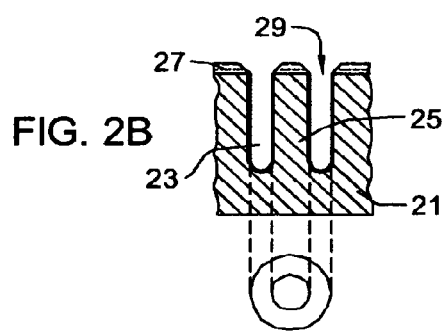

FIG. 2B shows a cross-sectional view along the dotted line of FIG. 2A. Annulus cavity 23 may be formed by any of a variety of known techniques, such as, etching. In general, the depth of the cavity will determine the length of the conductive via to be formed. As shown, the depth is less than the thickness of carrier 21. Since subsequent process steps involve back side grind/polishing steps to expose the cavity, the depth of the cavity should be consistent with the desired overall thickness of the end-product carrier substrate with conductive through vias.

In the presently preferred embodiment, carrier substrate 21 is silicon and the annulus cavity portion can be formed using a deep silicon etch through masking layer 27, as shown in FIG. 2B. Masking layer 27, normally a silicon oxide material, is formed upon silicon carrier 21 and is patterned using conventional lithographic techniques. In an exemplary arrangement, masking layer 17 comprises an oxide formed by a plasma-enhanced chemical vapor deposition (PECVD) process with a tetraethyl orthosilicate tetraethyl (TEOS) source, as known in the art. Next, a photoresist is deposited upon oxide masking layer 27 and cured using conventional photoresist processing techniques. The photoresist layer is patterned, preferably with an optical aligner and a photo mask, and is exposed and developed to create an annular opening in the photoresist corresponding to the desired annulus cavity pattern as shown in FIG. 2A. Next, the same annulus pattern is transferred by etching same into masking layer 27, as shown at 29 in FIG. 2B.

A deep reactive ion etch (RIE) method may be used to transfer the annulus feature, latterly defined by masking layer 27, into silicon carrier 21. Thus, deep silicon etching by fluorine radicals generated in a plasma, as is known in the art, may be employed. Such deep silicon structures can be fabricated using conventional available deep RIE systems, such as the A601E, available from Alcatel. The deep RIE method uses time-multiplexed deep etching (TMDE), a variation of side wall passivation, wherein deposition and etching cycles are performed alternately. In TMDE, the process cycles between deposition and etching may times until the target depth is reached. During the deposition step, side walls are passivated by a polymer deposited from a plasma formed from the deposition precursor. During the subsequent etching cycle, both the polymer and the silicon are preferentially etched from the bottom of the cavity or trench by ion bombardment. By switching between etching and deposition cycles, deep anisotropic structures having vertical side walls can be realized with very high etching rates in silicon substrates. Exemplary of such methods is that described in United States Patent Publication 20050037608, filed Aug. 13, 2003 and assigned to the present assignee, the teachings of which are incorporated herein by reference.

The deep silicon etch process forms an annulus cavity 23 typically having a gap (the width of the annulus cavity inner wall-to-outer wall) of 1µ to 10µ although, gaps of other dimensions are possible. Since the annulus cavity etch depth scales closely with the gap width of the annulus rather than the core 25 diameter over a wide practical range (approximately 5µ to beyond 100µ diameter), different core diameters may be made on a single carrier and etched to nominally the same depth. Thus, as core 25 material is removed and replaced with conductive material to form a through via, so also could other core material be simultaneously removed to allow conductive vias of different diameters be created in a single carrier having nominally the same depths.

Figure 2C:
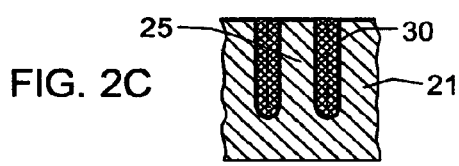

FIG. 2C shows the annulus cavity filled with an insulating material 30 for passivation. The insulating material 30 forms a passivation collar or dielectric annulus sleeve for isolating the core material region 25 of the carrier (and its replacement material) from the remainder of the carrier. Insulation of the cavity sidewalls may be achieved through any number of conventional techniques including, but not limited to, thermal oxidation in a tube furnace in an oxygen or steam environment between 900° C. and 1100° C. Also, low-pressure chemical vapor deposition (LPCVD) using TEOS at temperatures between 700° C. and 900° C. or plasma-enhanced chemical vapor deposition (PECVD) using silane or TEOS and oxygen or nitrous oxide, at temperatures between 300° C. and 600° C. may be used.

Small annulus gaps, i.e., gaps on the order of 2µ or less, may be completely filled during standard thermal oxidation due, at least in part, to the fact that the silicon dioxide product is less dense, and grows both outwardly and inwardly from the original external and internal silicon annulus cavity sidewall surfaces. This, then, defines a completely pinched-off insulating cylinder early in the front end processing of the silicon carrier. Accordingly, the through via metallization step used for via filling with conductive material is decoupled from the initial insulating step as seen, for example, by the fact that the metallization step is subsequently separately undertaken by etching out at least part of silicon core 25 and then filling same with a conductive material from the back side after carrier thinning, as explained hereinafter.

Larger annulus gaps may be partially closed using thermal oxidation and then filled, in conventional manner, with an additional insulating material such as polysilicon which, itself, may then be further oxidized to further close the annulus. Alternatively, small gaps of between 1μ and about 5μ may, for certain applications, be filled using CVD metal, such as Cu or W. After steps are taken to fill the annulus cavity, a planarization step would typically follow to planarize the carrier surface. As shown in FIG. 2C, an oxide insulating material 30 fills the annulus, with the oxide on carrier 21 surface having been planarized back to the original top surface of the carrier.

Figure 2D:
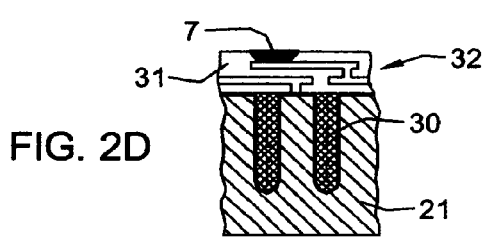
Figure 2E:
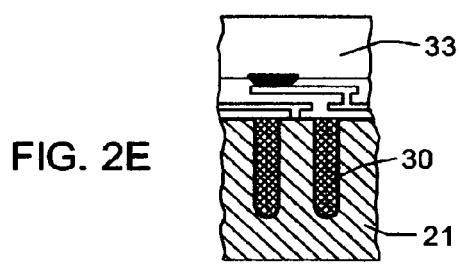

After planarization of the carrier surface as shown in FIG. 2C, wiring levels may be added to the surface, as shown in FIG. 2D. FIG. 2D shows two wiring levels 32 in insulation layer 31, a portion of which is connected to bond pad 7. Insulation layer 31 is fabricated using conventional deposition techniques, as is understood by those skilled in the art. As shown in FIG. 2E, a temporary handling layer 33, such as glass, is attached to the insulating layer 31. Handling layer 33 permits handling the silicon carrier for back side grinding and polishing, the results of which are shown in FIG. 2F.

Figure 2F:
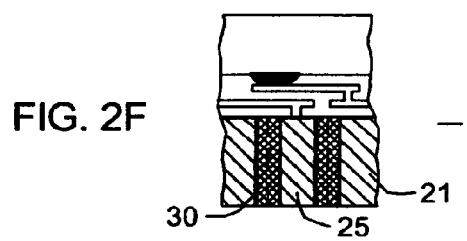

Any of a variety of techniques may be used to remove material from the back side of silicon carrier 21 to expose oxide insulating material 30 of the passivation collar formed thereby, as shown in FIG. 2F. For example, chemical mechanical polishing (CMP) may be used to remove the excess silicon material from the back side of the carrier to expose the passivation collar.

Figure 2G:
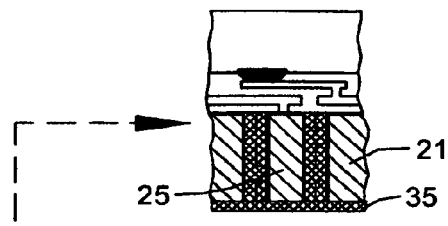
Figure 2H:
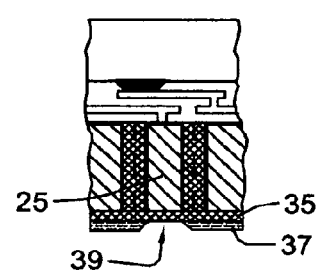
Figure 2I:
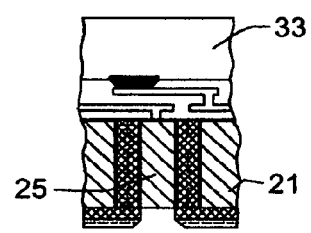

The polished back side of the silicon carrier is then covered with a layer of masking material 35, such as, an oxide, as shown in FIG. 2G. Typically, the oxide layer may be formed using PECVD, as described above. The oxide is patterned using a resist, typically as described above with respect to forming a pattern in oxide layer 27. The pattern formed here, as shown in FIG. 2H, is a circular opening 39 in resist 37 layer sufficient to allow the silicon core material 25 of the carrier to be removed by etching, for example. After forming circular opening pattern 39 in resist layer 37, the pattern is transferred to oxide layer 35 as shown in FIG. 2I, according to conventional techniques, such as etching.

Silicon core material 25 may be removed by any of a variety of wet and/or dry etching techniques. For example an RIE process may be employed, such as the deep RIE methods and system described above.

Figure 2J:
Figure 2K:
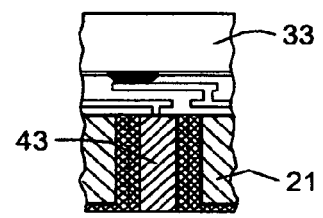
Figure 2L:
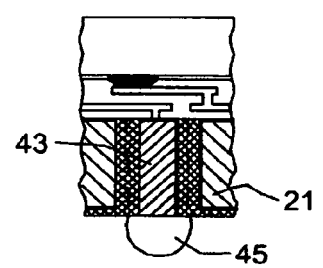

After silicon core material 25 is removed creating empty via 41, as shown in FIG. 2J, the via is filled with a conductive material 43, as shown in FIG. 2K. Any of a variety of conductive materials may be employed. For example, via 41 may be plated with a copper liner of, for example, 5μ thickness. The copper liner may then be CMP back to the carrier surface and filled with a high melt solder to form a solder via and bump. Alternatively, for small gap vias the via may be plated with copper 43 to fill the via and a carrier bump 45 evaporated thereon as shown in FIG. 2L.

FIGS. 3A-3L show a further series of steps depicting a process for fabricating a conductive through via structure in an electronic device carrier, in accordance with another embodiment of the present invention. Similar to FIGS. 2B-2L, FIGS. 3B-3L show cross-sectional views of a portion of an electronic carrier, sufficient to demonstrate how one through via may be fabricated, it being clear that a multiplicity of vias in a single carrier may be so fabricated.

As can be seen, the process steps in FIGS. 3A-3K are the same as those in FIGS. 2A-3K and will, therefore, not be further described, it being understood that the same disclosure used to describe FIGS. 2A-2K similarly applies to FIGS. 3A-3K. The process and structure of FIG. 3A-3K departs from the process and structure of FIG. 2A-2K in the arrangement of FIG. 2L, the difference residing in insulation layer 47 being first formed in contact with conductive via 43 prior forming contact bump 49.

Figure 3A:
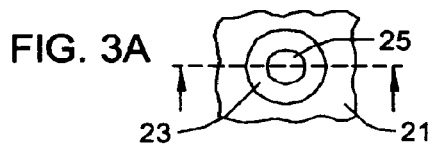
FIG. 3A-3L shows a series of process steps for fabricating a carrier structure in accordance with another embodiment of the present invention.
Figure 3B:
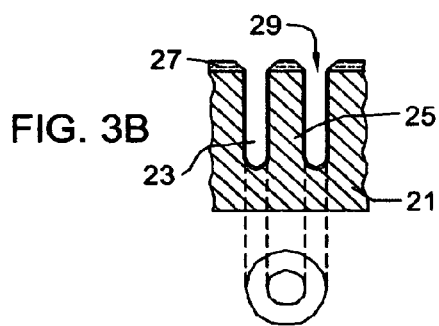
Figure 3C:
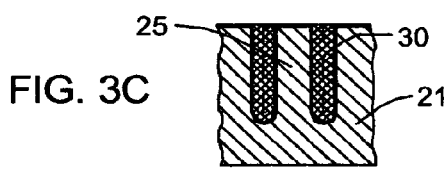
Figure 3D:
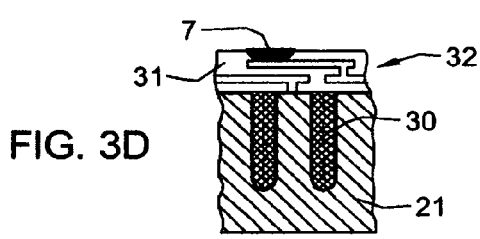
Figure 3E:
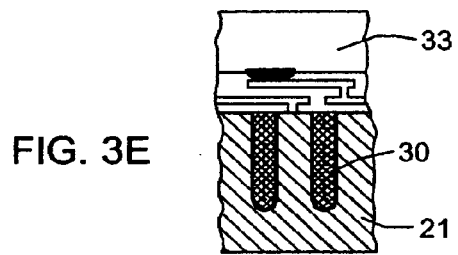
Figure 3F:
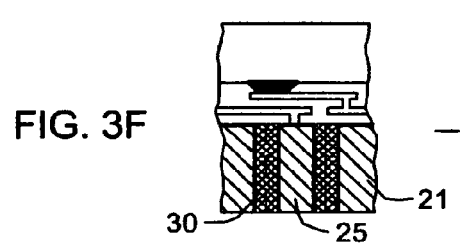
Figure 3G:
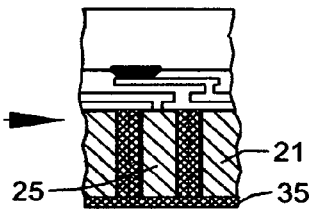
Figure 3H:
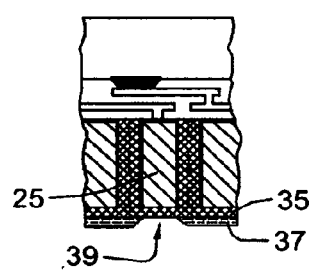
Figure 3I:
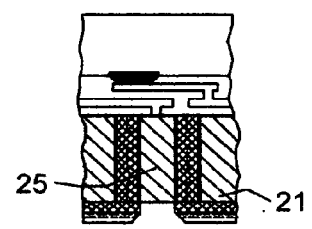
Figure 3J:
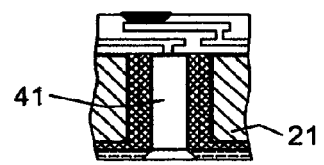
Figure 3K:
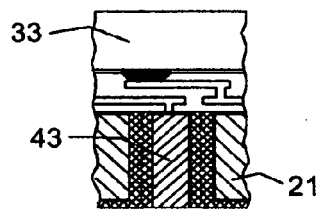
Figure 3L:
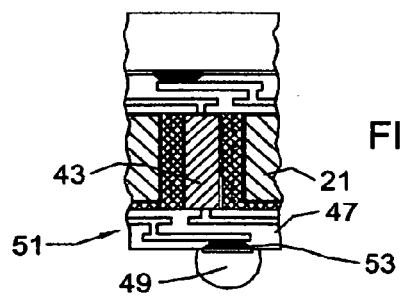

In this regard, FIG. 3L shows two wiring layers 51 in insulation layer 47, a part of which is in contact with conductive via 43. Bond pad 53, also in contact with the wiring layers 51, is bonded to contact bump 49, which typically is a high melt solder, such as a high melt C4 solder ball. Conventional techniques, as is understood by those skilled in the art, may be used to create insulating layer 47 with two wiring levels. It is clear that more than two wiring levels may be fabricated at either end of through via 43.

Figure 4A:
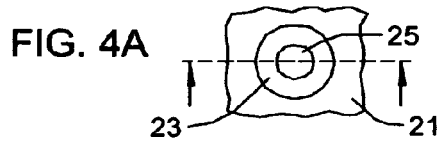
FIG. 4A-4L shows another series of process steps for fabricating a carrier structure in accordance with another embodiment of the present invention.
Figure 4B:
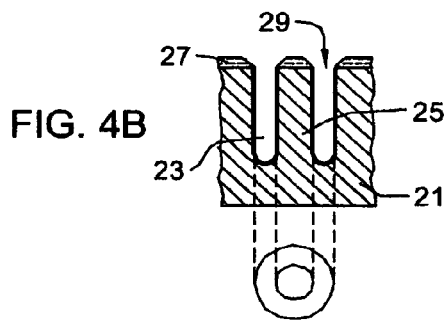
Figure 4C:
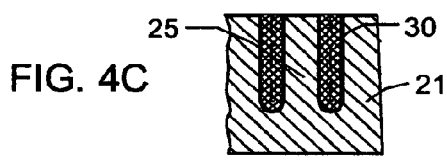
Figure 4D:
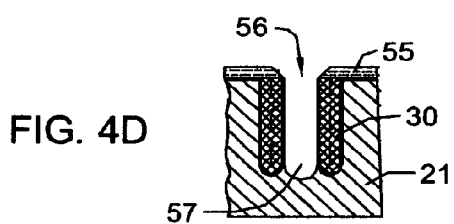

FIG. 4A-4L similarly shows a further series of steps depicting a process for fabricating a conductive through via structure in an electronic device carrier, in accordance with another embodiment of the present invention. The process of FIGS. 4A-4L departs from the process of FIGS. 2A-2L and FIGS. 3A-3L by removing silicon core 25 from the top side of carrier 21, as shown in FIG. 4D, rather than the back side.

Thus, the preceding description in regard to FIG. 2A-2C applies to FIGS. 4A-4C with like reference characters applying to like elements. However, after forming oxide material 30 in the form of an oxide collar and before any back end of line (BEOL) processing steps, an oxide masking layer 55 is formed on the top side of carrier 21 having a circular opening 56 sufficient to remove all or a portion of the core. Masking layer 55 with circular opening 56 may be formed using conventional techniques in the same manner in which masking layers 27 or 35 in FIG. 2B or 2H were formed. Similarly, silicon core material 25 may be removed, as shown in FIG. 4D, by etching in the same manner that silicon core material 25 was removed in FIG. 2I-J. In this regard, the etch process to form blind via 57 extends the via to the approximate level of insulating material 30.

Figure 4E:
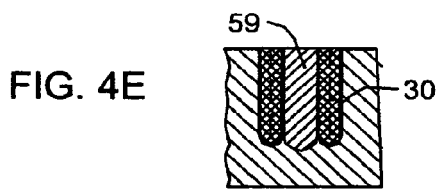

After removing silicon core 25 to form empty via 57, the via is filled with conductive material 59, similar to conductive material 43 in FIG. 2K. In this regard, although the conductive material 43 in FIG. 2K and conductive material 59 in FIG. 4E is preferably metal, such as copper, other conductive materials, such as conductive paste, may also be used.

Figure 4F:
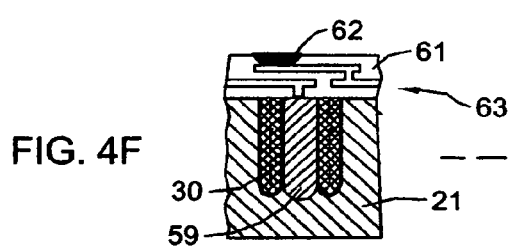
Figure 4G:
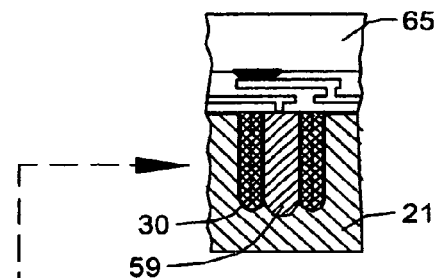
Figure 4H:
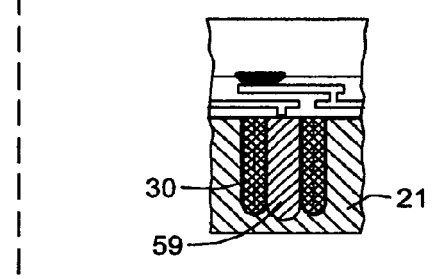

In FIG. 4F, BEOL processing steps are undertaken wherein a layer of insulation 61 with two wiring levels 63 is formed to contact conductive via 59. Top bond pad 62 made of, for example, Ni/Au, is also formed to contact the wiring levels 63. Glass handle 65 is then bonded to the layer of insulation, as shown in FIG. 4G, and a partial grinding/polishing of the back side of carrier 21 is undertaken, as shown in FIG. 4H. The back side grinding/polishing process is not extended, however, to expose conductive via 59 or insulating material 30.

Figure 4I:
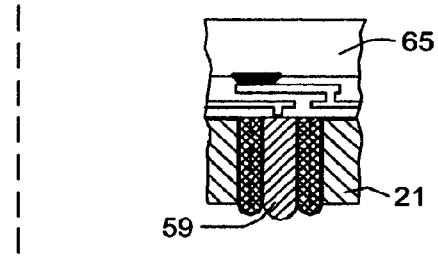
Figure 4J:
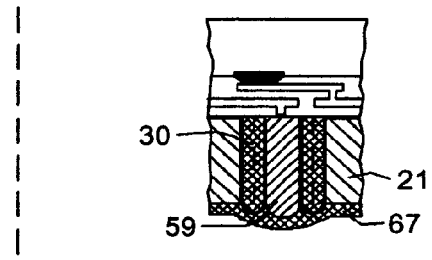
Figure 4K:
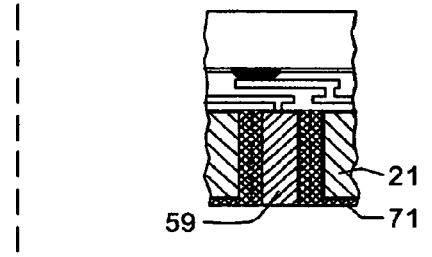
Figure 4L:
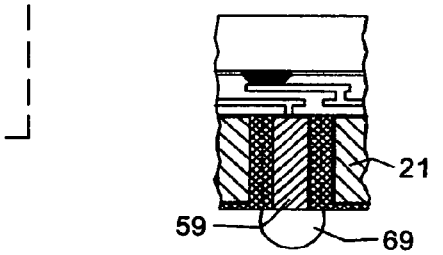

As shown in FIG. 4I, a silicon wet etch, for example, is used to recess the remainder of the silicon to expose conductive via 59 and insulating material 30. In this regard, the wet etching step extends etching to expose the conductive via and insulation above their distal points such as to accommodate a blanket CVD oxide deposition, for example to form oxide layer 67. The oxide layer 67 is then planarized by, for example, CMP to remove the oxide over conductive through via 59 and the passivation collar of material 30 to expose and also planarize same to remove their rounded portion, as shown in FIG. 4K. The planarization is such as to leave an oxide layer 71 on carrier 21 surrounding through via 59. A solder bump 69 may then be formed by evaporation, for example, on conductive via 59.

Figure 5A:
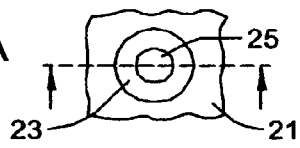
FIG. 5A-5L shows a series of process steps for fabricating a carrier structure in accordance with another embodiment of the present invention.
Figure 5B:
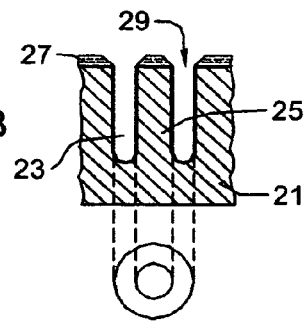
Figure 5C:
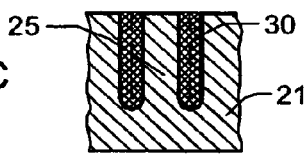
Figure 5D:
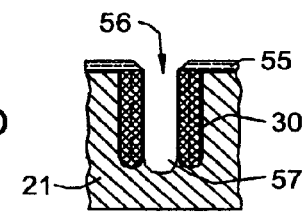
Figure 5E:
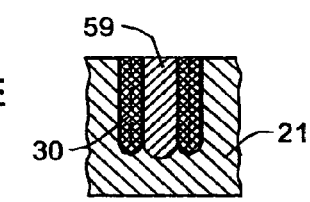
Figure 5F:
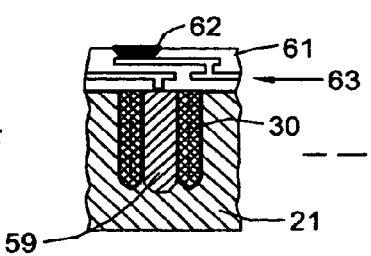
Figure 5G:
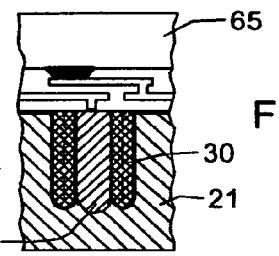
Figure 5H:
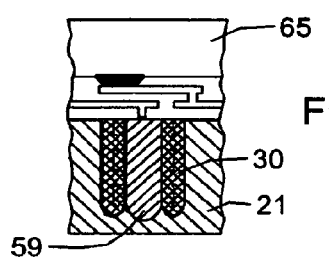
Figure 5I:
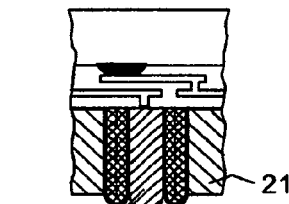
Figure 5J:
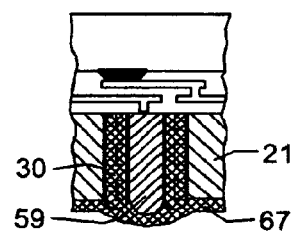
Figure 5K:
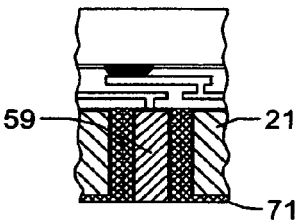
Figure 5L:
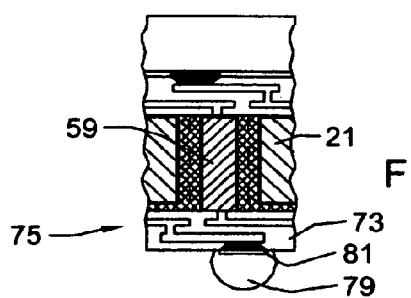

FIGS. 5A-5L show a further series of steps depicting a process for fabricating a conductive through via structure in an electronic device carrier, in accordance with another embodiment of the present invention. The process of FIGS. 5A-5L departs from the process of FIGS. 4A-4L at FIG. 5L. As shown at FIG. 5L, before a solder bump is formed, a layer of insulation 73 with two wiring levels 75 is formed on insulating layer 71. The wiring levels contact conductive through via 59 and bond pad 81. High melt solder bump 79 is bonded to pad 81. The same processing approaches as previously described may be used in the process of FIGS. 5A-5L.

FIGS. 6A-6N show a further series of steps depicting a process for fabricating a shielded conductive through via structure in an electronic device carrier or other electronic interfacing structure, in accordance with another embodiment of the present invention. Such structures may be used, for example, to reduce total conductive through via resistance or to build coaxial impedance matched structures.

FIG. 6A shows a partial top view of carrier 21 wherein a second annulus cavity 83 is formed concentric to a first annulus cavity 85. As shown in FIG. 6B, the pair of concentric annulus cavities 83 and 85 are formed through mask 87 in the same manner as the single annulus cavity of the preceding embodiments was formed. After deep etching annulus cavities 83 and 85, the cavities are filled with an insulating material 89 such as an oxide, by thermal oxidation, for example, as previously described. After the thermal oxidation step, the oxide is planarized to form a pair of concentric passivation collars of oxide 89, as shown in FIG. 6C. An insulating layer 91 with two levels of wiring 92 and a bond pads 94 are then formed so that the wiring levels connect to an inner first volume of core substrate material designated core region 93 and an outer second volume of concentric substrate material designated concentric annular core region 95, as shown in FIG. 6D. A temporary glass handling layer 97 is then bonded to the insulating layer 91, as shown in FIG. 6E. Handling layer 97 permits handling silicon carrier 21 for back side polishing and grinding to remove excess silicon material to the point of exposing and planarizing insulating material 89 that forms the pair of concentric passivation collars, as shown in FIG. 6F. CMP may, for example, be used for this purpose.

After planarizing the back side of silicon carrier 21, a layer of masking material 99, such as an oxide layer, is formed, as shown in FIG. 6G. A layer of resist 101 is then patterned, as shown in FIG. 6H, to allow etching a circular opening 96 in layer of masking material 99 over core material 93 and an annulus opening 98 over concentric core material 95. The latter openings are shown in FIG. 6I.

After forming openings in layer of masking material 99, the exposed silicon of core material 93 and concentric core material 95 is removed to expose the wiring levels in contact therewith, as shown in FIG. 6J. This creates a center post empty via 103 and annular empty via 105 concentric therewith. Silicon removal may be accomplished through etching, as previously described in the process description with regard to FIG. 2I-J, for example, with each core material 93 and 95 etched during the same etching step.

The resist layer 101 is then removed and the empty center post via 103 and annular empty via 105 are each filled with a conductive material, using processes previously described, to thereby form center conductive vias 107 and annular conductive via 109. This is shown in FIG. 2K. Typically, such material would be plated copper. However, each could be filled with a different conductive material, depending upon the application. The vias filled with conductive material define a center conductor (conductive via 107) and conductive shield (annular conductive via 99), the latter being an annulus-shaped conductor filling the gap between the passivating collars formed by insulating material 89.

As shown in FIG. 6L, an insulating layer 111, such as an oxide, is then deposited followed by the depositing of resist layer 113. A circular opening pattern 115 is formed in the resist 113 by conventional techniques, and the pattern is transferred by etching into oxide layer 111 to form circular opening 117 which acts to expose core conductive via 107, as shown in FIG. 6M. Etching of oxide layer 111 may be by RIE. After removing resist layer 113, solder bump 119 may then be deposited upon conductive via 107, as shown in FIG. 6N. Typically, a high melt solder is deposited to form C4 solder bumps.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of making an electronic structure, comprising:
providing a substrate having an external surface including an external and internal sidewall and a bottom wall defining a cavity with said internal sidewall forming a perimeter around a first volume of said substrate;
forming an insulating layer on said external and internal sidewall and said bottom wall to at least partially fill said cavity;
removing a portion of said substrate below said bottom wall of said cavity; and
removing at least a portion of said first volume of said substrate to form an opening therein.

2. The method as set forth in claim 1 wherein said step of removing at least a portion of said first volume of said substrate to form an opening therein is carried out by removing from said external surface.

3. The method as set forth in claim 1 wherein said step of removing at least a portion of said substrate below said bottom wall of said cavity removes said substrate to expose said first volume of said substrate and said step of removing at least a portion of said first volume of said substrate to form an opening therein is carried out by removing from the said first volume of said substrate exposed by said step of removing at least a portion of said substrate.

4. The method as set forth in claim 3 further comprising the step of forming an insulating layer on at least a portion of said external surface of said substrate, said insulating layer including an electrically conductive structure positioned within the said perimeter of said internal sidewall.

5. The method as set forth in claim 4 wherein said opening is filled with a conductive material to contact at one end thereof said electrically conductive structure of said insulating layer positioned within the said perimeter of said internal sidewall.

6. The method as set forth in claim 5 wherein an electrical contact is formed to connect to another end of said conductive material.

7. The method as set forth in claim 6 wherein said substrate is a silicon substrate and wherein active devices and electrical components are formed within said external surface of said silicon substrate.

8. The method as set forth in claim 7 wherein another insulating layer including an electrically conductive structure is formed at least over the said another end of said conductive material so that said electrically conductive structure is in contact with the said another end of said conductive material.

9. The method as set forth in claim 7 wherein said step of forming an insulating layer on said external and internal sidewall and bottom wall is formed by thermal oxidation of said silicon.

10. The method as set forth in claim 2 wherein said opening is filled with a conductive material.

11. The method as set forth in claim 10 further comprising the step of forming an insulating layer on at least a portion of said external surface of said substrate, said insulating layer including an electrically conductive structure positioned to contact said conductive material.

12. The method as set forth in claim 11 wherein said step of removing a portion of said substrate below said bottom wall of said cavity comprises removing a portion of said substrate to expose said conductive material.

13. The method as set forth in claim 1 wherein said step of removing at least a portion of said first volume of said substrate comprises removing said first volume of said substrate.

14. The method as set forth in claim 1 wherein said step of providing a substrate having an external surface including an external and internal sidewall and a bottom wall defining a cavity with said internal sidewall forming a perimeter around a first volume of said substrate comprises providing a cavity formed as an annulus cavity.

15. The method as set forth in claim 14 wherein step of providing a cavity formed as annulus cavity includes providing another annulus cavity defined by an external and internal sidewall and a bottom wall with said internal sidewall forming a perimeter which is concentric with said first recited annulus cavity and the region therebetween acts to form a second volume of said substrate material with said second volume of said substrate material being removed.

16. An electronic structure, comprising:
a substrate having an external surface including an external and internal sidewall and a bottom wall defining an annulus cavity with the internal sidewall forming a perimeter around a first volume of said substrate;
insulating material covering said external and internal sidewall and said bottom wall to at least partially fill said cavity;
an insulating layer covering at least a portion of the external surface of said substrate with said insulating material including an electrically conductive structure positioned within the perimeter of the internal sidewall; and
conductive material filling a through via within at least a portion of said first volume of substrate to contact at one end thereof to said electrically conductive structure.

17. The electronic structure as set forth in claim 16 wherein said cavity is filled with material to form a generally planar surface.

18. The electronic structure as set forth in claim 17 wherein said insulating layer including an electrically conductive structure includes distribution metallurgy and bond pad structure on said generally planar surface.

19. The electronic structure as set forth in claim 17 further including an electrical contact connected to the other end of said conductive material.

20. The electronic structure as set forth in claim 19 wherein said conductive material fills said first volume of said substrate.

21. The electronic structure as set forth in claim 19 wherein said electrical contact includes distribution metallurgy in contact with a solder ball.

22. The electronic structure as set forth in claim 16 wherein said substrate includes a second annulus cavity concentric with the first recited annulus cavity and with said second annulus cavity filled with an insulating material.

23. The electronic circuit as set forth in claim 22 wherein the annular region between said first annulus cavity and second annulus cavity is filled with a conductive material.

24. A method of making an electronic structure, comprising:
providing a substrate having an external surface including an external and internal sidewall and a bottom wall defining a cavity having a core formed by said internal sidewall forming a perimeter around a first volume of said substrate;
forming an insulating layer on said external and internal sidewall and said bottom wall to at least partially fill said cavity to form passivation collar around said core; and;
removing a portion of said substrate below said bottom wall of said cavity.

25. The method as set forth in claim 24 including the step of removing at least a portion of said first volume of said substrate to form an opening therein.

26. The method as set forth in claim 25 wherein said step of removing at least a portion of said substrate below said bottom wall of said cavity removes said substrate to expose said first volume of said substrate and said step of removing at least a portion of said first volume of said substrate to form an opening therein is carried out by removing from the said first volume of said substrate exposed by said step of removing at least a portion of said substrate.

27. The method as set forth in claim 26 further comprising the step of forming an insulating layer on at least a portion of said external surface of said substrate, said insulating layer including an electrically conductive structure positioned within the said perimeter of said internal sidewall.

28. The method as set forth in claim 27 wherein said opening is filled with a conductive material to contact at one end thereof said electrically conductive structure of said insulating layer positioned within the said perimeter of said internal sidewall.

29. The method as set forth in claim 24 wherein said step of providing a substrate having an external surface including an external and internal sidewall and a bottom wall defining a cavity with said internal sidewall forming a perimeter around a first volume of said substrate comprises providing a cavity formed as an annulus cavity.

30. The method as set forth in claim 29 wherein step of providing a cavity formed as an annulus cavity includes providing another annulus cavity defined by an external and internal sidewall and a bottom wall with said internal sidewall forming a perimeter which is concentric with said first recited annulus cavity and the region therebetween acts to form a second volume of said substrate material.

* * * * *